(12) United States Patent
Klatt (10) Patent No.: US 6,276,944 B1
(45) Date of Patent: Aug. 21, 2001

(54) CONTACTING UNIT FOR A CARD-SHAPED CARRIER ELEMENT OF ELECTRONIC MODULES, ESPECIALLY ACCORDING WITH PCMCIA STANDARDS

(75) Inventor: Dieter Klatt, Wülfrath (DE)

(73) Assignee: Stocko Contact GmbH & Co. KG (DE)

( * ) Notice: Subject to any disclaimer, the term of this patent is extended or adjusted under 35 U.S.C. 154(b) by 0 days.

(21) Appl. No.: 09/486,767
(22) PCT Filed: May 25, 1999
(86) PCT No.: PCT/EP99/03560
  § 371 Date: Feb. 28, 2000
  § 102(e) Date: Feb. 28, 2000
(87) PCT Pub. No.: WO00/01210
  PCT Pub. Date: Jan. 6, 2000

(30) Foreign Application Priority Data

Jun. 29, 1998 (DE) .............................................. 298 11 425

(51) Int. Cl.[7] .............................. H01R 12/00; H05K 1/00
(52) U.S. Cl. ........................ 439/76.1; 439/638; 439/94.5
(58) Field of Search ................................... 439/76.1, 638, 439/945, 946; 235/441

(56) References Cited

U.S. PATENT DOCUMENTS

| | | | | |
|---|---|---|---|---|
| 5,519,571 | * | 5/1996 | Shieh | 439/638 |
| 5,877,488 | * | 3/1999 | Klatt et al. | 235/486 |
| 5,940,275 | * | 8/1999 | Laity | 439/946 |
| 6,004,144 | * | 12/1999 | Yeh et al. | 439/76.1 |
| 6,069,795 | * | 5/2000 | Klatt et al. | 439/946 |

* cited by examiner

*Primary Examiner*—Khiem Nguyen
*Assistant Examiner*—Hae Moon Hyeon
(74) *Attorney, Agent, or Firm*—Robert W. Becker & Associates (57) ABSTRACT

A contact unit for a card-shaped carrier element of electronic components is provided. The contact unit includes an insertable card-shaped housing that has a base plate and a cover plate that is congruent to the base plate at least in the transverse direction. Formed between the base plate and the cover plate is a slot-like insertion channel that opens on one side of the housing for accommodating a chip-card. At the opposite side is provided a plug-in strip. Disposed parallel to the insertion channel, in the housing, is a printed circuit board that is electrically connected to the plug-in strip and that is provided on its surface with a contact field for contact with the chip-card. The insertion channel is continuously open on both sides over its entire length in the direction in which the chip-card is inserted. The base plate and the cover plate are securely attached to one another solely in the region adjacent to the insertion channel in the direction of insertion.

14 Claims, 10 Drawing Sheets

CONTACTING UNIT FOR A CARD-SHAPED CARRIER ELEMENT OF ELECTRONIC MODULES, ESPECIALLY ACCORDING WITH PCMCIA STANDARDS

BACKGROUND OF THE INVENTION

The invention concerns a contact unit for a card-shaped carrier element of electronic components, especially in accordance with PCMCIA standards, comprising a plug-in or insertable card-shaped housing that comprises a base plate and a cover plate that is congruent thereto at least in the transverse direction, between which is formed a slot-like insertion channel that opens on one side of the housing for accommodating a chip-card, and that at the opposing side is provided a plug-in strip, and furthermore comprising arranged parallel to the insertion channel in the housing a printed circuit board that is connected electrically to the plug-in strip and that is provided on its surface with a contact field for contact with the chip-card.

Given the increasing miniaturization in the field of computer technology, electronic components are more and more frequently arranged on or in card-shaped carrier elements with a view toward variability and transportability. Frequently encountered are carrier elements in accordance with PCMCIA standards that are cards that comprise a standard-compliant matrix-like connector strip and can accommodate a great variety of electronic components, depending on application. For instance, such cards are employed as memory expansion cards, drive cards, modem cards, etc. The interface to a data processing system (e.g., a notebook computer) is created by means of the plug-in strip, which effects a mechanical and electrical contact with a PCMCIA slot in the data processing system.

Widely used are chip-cards that have integrated circuits and comprise flush contact fields arranged for contact with, e.g., correspondingly designed reading units. Known areas of application for this type of chip-cards are currently telephone cards, authorization cards, or what are known as "SmartCards".

Known in the current art are contact units that make it possible to connect a chip-card to a PCMCIA standard interface in a data processing system. The combination of a PCMCIA card and a chip-card contact unit that can be inserted into a corresponding modular insertion slot in a computer and then read is useful in a wide variety of applications (e.g., electronic banking, pay TV, authenticating access authorization to data networks, etc.). The disadvantage is that known chip-card readers of this type comprise an extension in the housing in the form of an enlarged insertion guide for the chip-card that extends beyond the insertion area of the modular insertion slot in the computer and that simultaneously provides a grip for the user. This means the readers are substantially longer than standard PCMCIA cards so that when in the operating position this extension projects out of the insertion slot, e.g., in a notebook computer, so that during mobile operation there is a risk that the contact unit will jam in the slot or might even be bent or damaged. This extension has thus far been considered necessary for safely guiding the chip-card into and out of the slot-type insertion channel without the risk of inserting the card improperly—that is, for introducing, retaining, and removing a chip-card.

As the usage of transportable computers (e.g., laptop and notebook computers) continues to increase, there is a technical requirement that a chip-card reader situated in the operating position be completely insertable into the slot in the computer without projecting parts interfering with usage. This becomes important, e.g., when a chip-card must be inserted for personal authorization to use the computer. Although contact elements are known that do not comprise an extension and thus correspond to the PCMCIA standard, these are provided at least partially with closed sides in order to achieve lateral guidance for the chip-card. However, a significant market requirement is that the width of a contact unit also comply exactly with the PCMCIA standard so that even the wall thickness, $1/10$mm, for the sides does not deviate substantially from the PCMCIA standard. An additional disadvantage of very thin-walled sides is that the slightest misplacement of the chip-card when it is inserted into the contact unit can damage the card. An additional disadvantage results when the thin sides are deformed and it is then no longer possible to insert the chip-card.

The object of the invention is to further develop a contact unit for a card-shaped carrier element in electronic components such that the contact unit can be completely inserted into a PCMCIA slot in a computer without parts projecting therefrom and the object is furthermore also to ensure that proper insertion is still possible and that there is sufficient mechanical stability and simple manufacture.

This object is achieved in a contact unit of the type cited in the foregoing in that the insertion channel is continuously open over its entire length in the direction the chip-card is inserted and in that the base plate and cover plate are securely attached to each other solely in the region adjacent to the insertion channel in the direction of insertion.

The features in accordance with the invention make it possible to provide a contact unit the length and width of which comply precisely with the PCMCIA standard, e.g., Type II, and which can be inserted in its entirety into the PCMCIA slot of a computer (e.g., a notebook computer) without parts projecting therefrom. The complete insertability precludes any risk of damage, especially during transport, wherein a protective flap can also be provided that closes the PCMCIA slot when the contact unit is inserted. Of course, in this case it is not possible to leave a chip-card in the contact unit since, corresponding to the length of the region adjacent to the insertion channel, it projects from the contact unit when in its inserted position.

In a preferred embodiment of the invention, the connection of base plate and cover plate in the region adjacent to the insertion channel in the direction of insertion is also a swivelling axis relative to which the base plate and cover plate can swivel slightly such that the height of the insertion channel can be changed against the effect of a restoring force. The advantage of this is that when inserted into the insertion channel the chip-cards can be retained clamp-like in the channel. It is particularly advantageous when the height of the insertion channel declines as the distance from the connection increases when there is no chip-card inserted therein. When the chip-card is inserted into the insertion channel, the latter expands and the chip-card is held securely in the channel by means of inherent elastic return deformation. At the same time a high degree of form stability in the contact unit and compensation of production tolerances can be achieved in this manner.

Furthermore, a particular advantage is that the printed circuit board is connected at its end opposing the plug-in strip to a metal strip that is affixed to the printed circuit board in the housing and that comprises flexibly extending tabs that electrically conductively adjoin the metal cover plate. The metal strip in this manner keeps the printed circuit board level in the housing and also provides a grounded transition to the printed circuit board. With regard to this latter, it is necessary that the metal strip is connected to grounded contact surfaces in the printed circuit board. In order to facilitate simple assembly, in accordance with an additional feature of the invention the metal strip is arranged on a plastic profile that is connected to the cover and that constitutes an upper insertion guide for the chip-card. The plastic profile can be provided on its side facing the insertion channel guides for a chip-card and can be joined to the metal strip, e.g., by clamping, adhesive, or locking means.

In accordance with a further advantageous development of the invention, provided in the insertion channel is at least one spring element, the one end of which is securely joined to the cover plate and the other, free end of which can be detachably attached to the base plate. The spring element fulfills a plurality of roles. When no chip-card is inserted, the spring element ensures that the height of the insertion channel remains the same against the action of the restoring force so that the chip-card can be easily introduced. Since the free end of the spring element is detachably attachable to the base plate, the insertion channel is simultaneously protected against outward expansion. This provides the contact unit additional form stability. Introducing the chip-card releases the free end and the spring element is bent in the insertion channel in the direction of the cover plate so that due to this spring-effect the chip-card is subjected to increased pressure which also ensures the contact. Advantageously the spring element is produced integral to the metal strip and when a chip-card is inserted extends to the cover plate through cut-outs in the printed circuit board so that chip-card and metal cover plate are conductively connected to each other, whereby static charging of the chip-card can be prevented. Securing the free end of the spring element on the base plate also makes it possible to achieve a bonding point between cover plate, printed circuit board, and base plate when there is no chip-card inserted. The metal strip and the spring element are cost-effective to produce by means of stamping and bending as strip-type goods and can be joined to the cover plate or to the plastic profile constituting the upper insertion guide in a single step by means of caulking, adhesive, welding, or ultrasound welding.

In order to obtain the compression/tension effect with the spring element, it is useful to embody the spring element in an approximate S-shape and to provide at its free end a claw-shaped extension that engages a mating lock element for securing the spring element. In accordance with an additional feature of the invention, it is advantageous to provide the lock element an undercut in which the claw-shaped extension of the spring element is releasably held. In an advantageous embodiment of the invention it is furthermore suggested that the lock element is embodied in a reinforcing plate made of plastic or metal that is joined to the base plate. While a reinforcing plate made of plastic can be joined to the metal base plate by means of injection molding, a metal reinforcing plate can be joined to the base plate by means of welding or adhesive. Advantageously the lock element is employed as a separate component in the reinforcing plate or as a cut-out in the reinforcing plate that is at least single-layer. In the latter case the undercut in the lock element can be produced by punching or stamping a single-layer reinforcing plate or by the offset arrangement of two reinforcing plates, one above the other and provided with openings. If, however, the lock element comprises a separate component, it is useful to prefabricate this component and press it into an opening in the reinforcing plate.

In accordance with an additional feature of the invention, the base plate at its end opposing the plug-in strip is provided with a plastic profile that functions as a lower insertion guide in order to ensure that the chip-card can be easily inserted. The plastic profile can be provided guides analogous to those for the upper insertion guide.

In an advantageous embodiment of the invention it is furthermore suggested that the base plate and cover plate are each provided at said plug-in strip with plastic holders arranged on the edge for fastening thereto that can be securely joined by means of a plastic bond like adhesive, ultrasound welding, or heat pressing. Base plate and cover plate can be securely joined in this manner. Alternatively, or in addition thereto, in accordance with an additional feature of the invention the base plate and cover plate are congruent and are welded to each other at lateral welded brackets. In this case it is particularly advantageous when the length of the secure joining of base plate and cover plate is approximately 30% of the overall length of the contact unit because this results in high form stability in the contact unit. Finally, it is suggested that an end stop comprising a stop angle is provided for limiting the insertion of the chip-card. Depending on requirements, insertion of the chip-card can also be limited by the lateral welding brackets or by the plastic holders, which are then provided with appropriate rounded stop surfaces.

BRIEF DESCRIPTION OF THE DRAWINGS

Additional details, features, and advantages of the subject of the invention can be appreciated from the following description of two exemplary embodiments, with reference to the associated drawings, in which:

FIG. 4a illustrates a side view of the contact unit in accordance with FIG. 1a;

DESCRIPTION OF THE PREFERRED EMBODIMENTS

Figures 1, 1A:
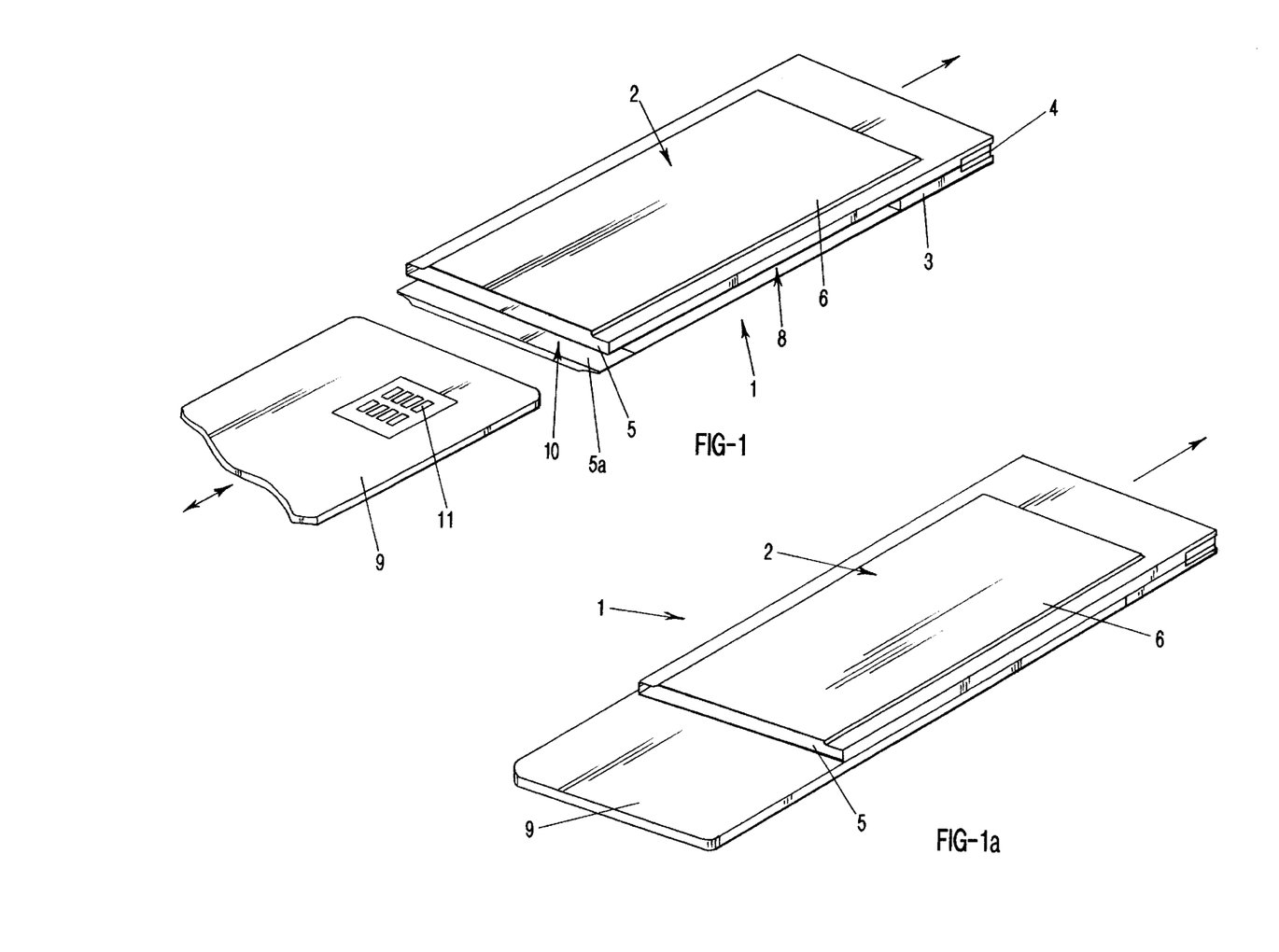
FIG. 1 is a perspective view of a contact unit that does not have a chip-card inserted therein.
FIG. 1a is a perspective view of the contact unit in accordance with FIG. 1 into which a chip-card has been inserted.
Figure 1B:
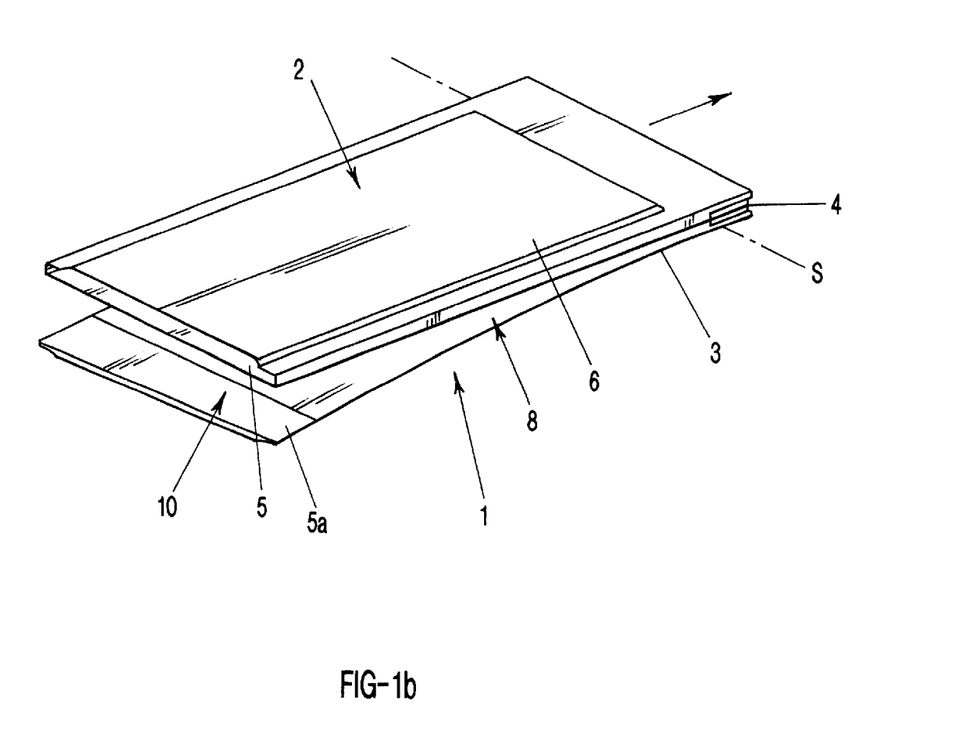
FIG. 1b is a perspective view of the contact unit in accordance with FIG. 1 showing swiveling of the base plate and the cover plate relative to one another.

The exemplary embodiment of the invention illustrated in FIG. 1 shows a contact unit 1 designed as a chip-card reader that is provided for contact with a notebook computer by means of a standard PCMCIA interface. The contact unit 1 comprises a two-member external housing 2 having a base plate 3, a PCMCIA interface field in the form of a plug-in strip 4 with 68 poles at the front end (relative to the direction in which it is inserted into the notebook computer, as indicated by the arrow), an upper and lower insertion guide 5, 5a on the opposing end for introducing a chip-card 9, e.g., in accordance with ISO 78 16, and a cover plate 6 that extends parallel to and at a distance from the base plate 3 and that is rigidly joined to the base plate 3 in the region of the plug-in strip 4. The parts of the contact unit cited are carried by the interior plastic profile elements made of PCB and illustrated in FIGS. 2 and 3, which furthermore hold a PCMCIA printed circuit board 7 spaced parallel to the base plate 3 in such a manner that formed therebetween is an insertion channel 8 for the ISO 78 16 chip-card 9 that is insertable into the contact unit via an insertion slot 10 between the insertion guides 5, 5a. The chip-card 9 can be inserted into and withdrawn from the contact unit 1 in the direction of the double arrow shown in FIG. 1, wherein contact can be created by means of the chip field 11 arranged on the surface of the chip-card 9 and a contact field 11' on the underside of the PCMCIA printed circuit board 7, which contact makes it possible to process the chip-card via the PCMCIA card when the contact unit 1 is inserted into the notebook and is connected to its PCMCIA interface via the plug-in strip 4.

Figure 2:
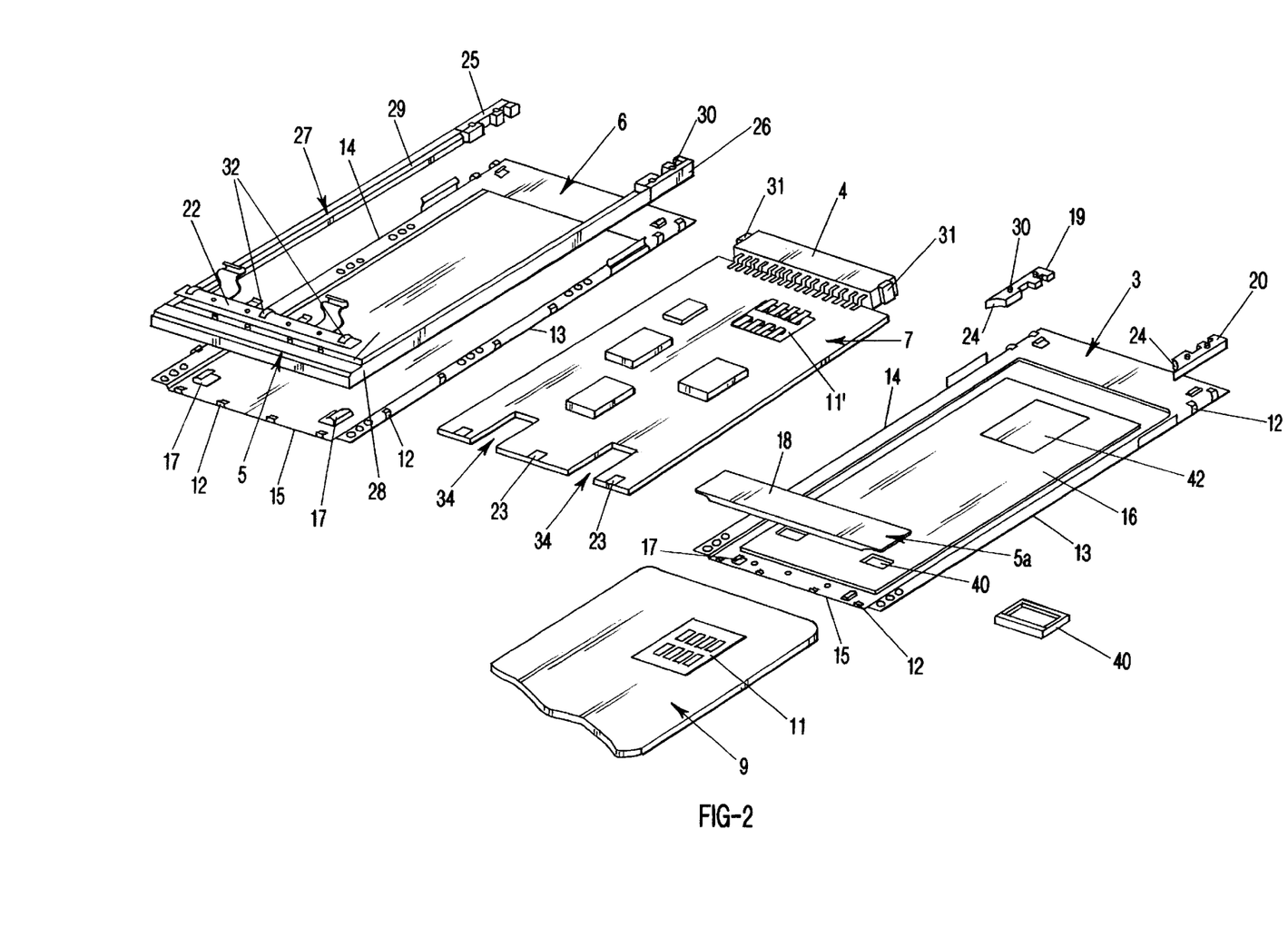
FIG. 2 illustrates the individual parts of the contact unit in accordance with FIG. 1 in a perspective view of housing members that have been flipped open and taken apart and their internal composition.

FIG. 2 illustrates the two individual members of the external housing 1, i.e., the base plate 3 in a perspective view of the interior and the cover plate 6, flipped 180°, also in a perspective view of the interior. Base plate 3 and cover plate 6 are separate pieces of sheet that are not joined to each other and that have clips 12 bent inward on the longitudinal sides 13, 14 and in the back side 15 (relative to direction of insertion), while the front side (relative to direction of insertion) remains free so that the plug-in strip 4 can be arranged there later. In the exemplary embodiment illustrated in FIG. 2, the base plate 3 is provided with a welded reinforcing plate 16 that makes it possible to employ an extraordinarily thin housing sheet of approximately 2/10mm thickness. It should be appreciated that instead of metal, a reinforcing plate 16 made of plastic can be used that can be manufactured, along with other plastic parts described below, in a single process step by means of injection molding.

The clips 12 comprise an L shape and it is provided that these be punched from the sheet of the base plate 3 and cover plate 6, bent upward 90° out of the plane toward the interior and then be bent again 90° inward so that there is a free leg that projects into the subsequent interior of the contact unit 1 parallel to the base plate 3 and cover plate 6 at the clips 12, which represents a particularly advantageous fastening device for coating the clips 12, also described below. The number and arrangement of the clips 12 on the base and cover plates 3, 6 are coordinated to provide a housing that is as torsion-proof as possible, wherein it has proved useful to provide a plurality of clips 12 on the cover plate 6, while on the base plate 3, the plastic profile 18 that constitutes the lower insertion guide 5a is held in place with clips 12 on the side 15 and with hooks 17. The hooks 17 are likewise punched from the sheet for the base plate 3 and bent upward and inward in an L shape. In principle, instead of using clips 12 and hooks 17 punched out of the material of the base and cover plates, it is also possible to use separate fastening elements that then must be mechanically joined to the housing members.

FIG. 2 furthermore illustrates the plastic profiles employed in the interior of the contact unit 1, which profiles in the preferred embodiment are not however manufactured separately and introduced into the housing but rather are manufactured in connection with the corresponding metal parts of the housing in a single process step in the injection molding process. Provided in the front region of the base plate 3 (relative to the direction of insertion) for holding the plug-in strip 4 are plastic holders 19, 20 that simultaneously constitute axial stops for limiting the insertion of the chip-card 9 and that comprise corresponding rounded stop surfaces 24.

The plastic holders 19 correspond to correctly shaped holders 25, 26 on the free ends of a U-shaped plastic frame 27 that belongs to the cover plate 6 and that at its closed side comprises a strip 28 constituting the upper insertion guide 5 and provided with a platform-type tier 21 for attaching a metal strip 22. The longitudinal legs of the plastic frame 27 comprise a guide that is open toward the interior and that is in the form of a step 29 for engaging and holding the printed circuit board 7, which when assembled is fixed by the plastic frame 27, wherein the holders 25, 26 together with the plastic holders 19, 20 fix the plug-in strip 4 connected to the printed circuit board 7. The plastic elements illustrated in FIGS. 2 and 3 are furthermore provided various positioning projections and recesses 30 for positioning purposes.

The printed circuit board 7 shown adjacent thereto is arranged on the cover plate 6, flipped 180°, such that at the front the knobs 31 on the side of the plug-in strip 4 engage in the corresponding recesses on the plastic holders 25, 26 and opposing grounded contact surfaces 23 in the printed circuit board 7 are pushed flush under the clamp contacts 32 in the metal strip 22. The base plate 3 is arranged flipped 180° on the cover plate 6. This means that formed between the base plate 3 and the cover plate 6 with the printed circuit board 7 is the insertion channel 8 that remains free for introducing the chip-card 9 and that makes it possible for the chip field 11 to contact the PCMCIA card through the contact field 11'.

Figure 3:
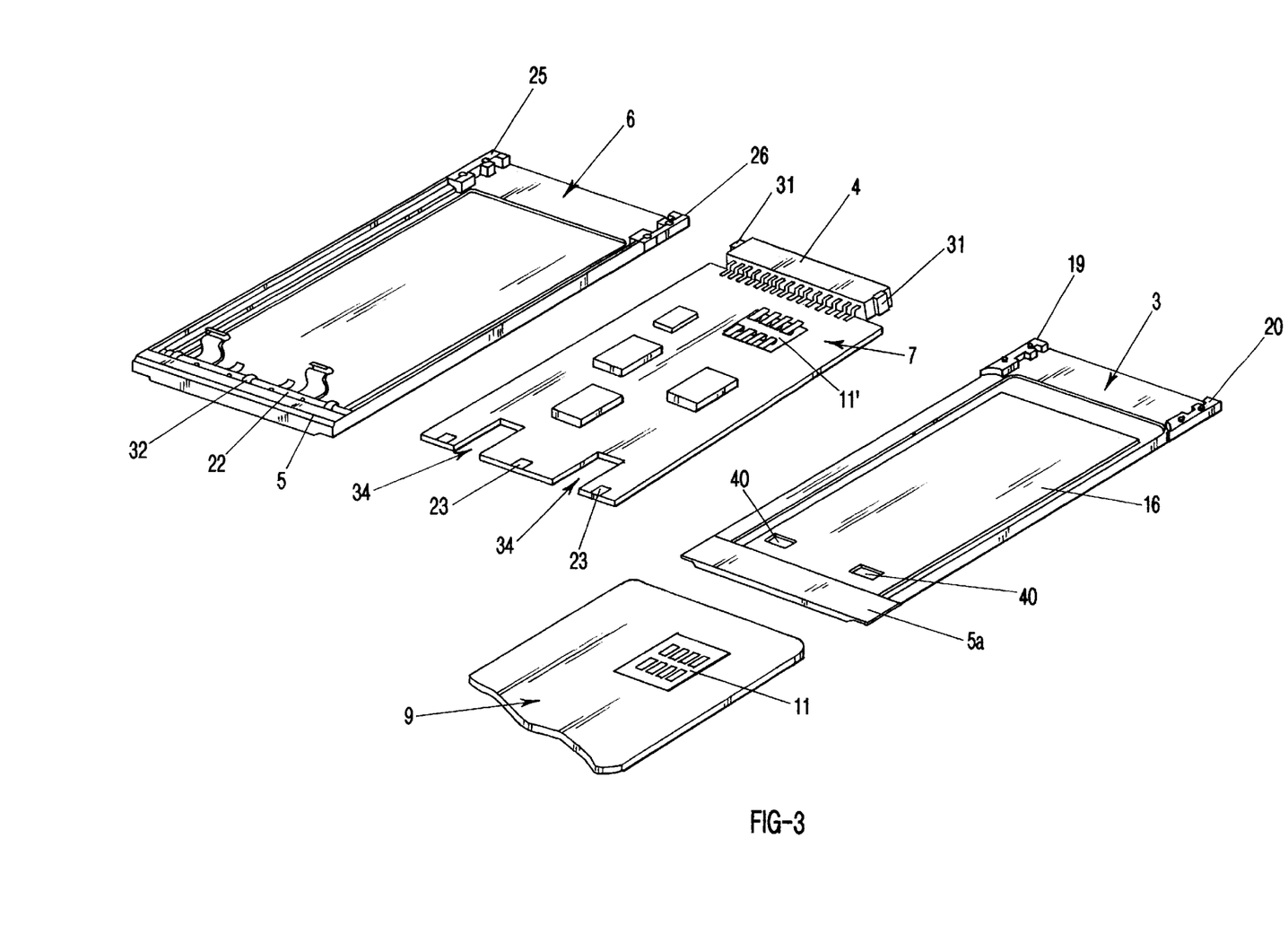
FIG. 3 illustrates the individual parts of the contact unit in accordance with FIG. 2 in an intermediate stage of assembly.

The base plate 3 and the printed circuit board 7 in FIGS. 2 and 3 are not shown in their assembled positions, but flipped 180° in order to make it possible to see the interior. It shall be appreciated that allocated to the cover plate 6 is the U-shaped plastic frame 27, which is held to the cover plate 6 by the corresponding clips 12 and upon which the prepared base plate 3 is placed after assembly with the printed circuit board 7 in the manner described.

In addition, in contrast to FIG. 2, FIG. 3 illustrates the correct arrangement of the plastic elements on the base plate 3 and cover plate 6, wherein it can be seen that the clips 12 are no longer visible. This is due to the preferred manufacturing process used during the manufacture of the contact unit 1 in which the exterior housing members in the form of base plate 3 and cover plate 6 are punched as separate pieces of sheet that are not connected to each other, the clips 12 and hooks 17 being punched and bent inward at the same time; in a second process step the base plate 3 is provided with the plastic holders 19, 20 and the plastic profile 18 and the cover plate 6 is provided with the plastic frame 27, this being done separately using an injection molding process in the form of a unit. The printed circuit board 7 and its plug-in strip 4 are then flipped 180° and placed onto the cover plate 6, positioned on the metal strip 22 and the plastic holders 25, 26, and in a final process step the housing members pre-assembled in this manner with interior plastic elements are arranged upon each other and joined to each other by means of a plastic joining technique, particularly adhesive or ultrasound welding.

Figure 3A:
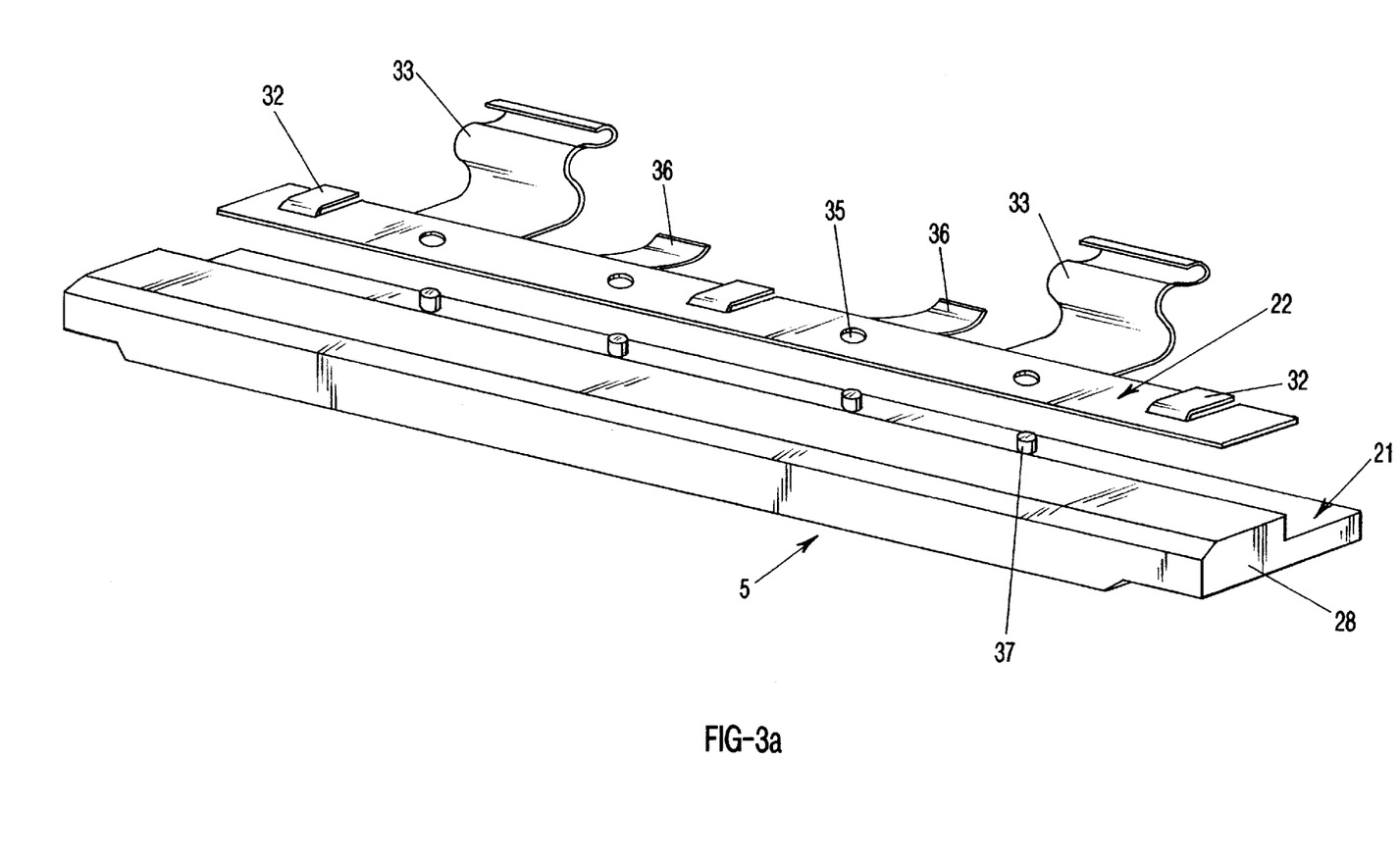
FIG. 3a is a perspective exploded view of the attachment of a metal strip to a plastic profile.
Figure 3B:
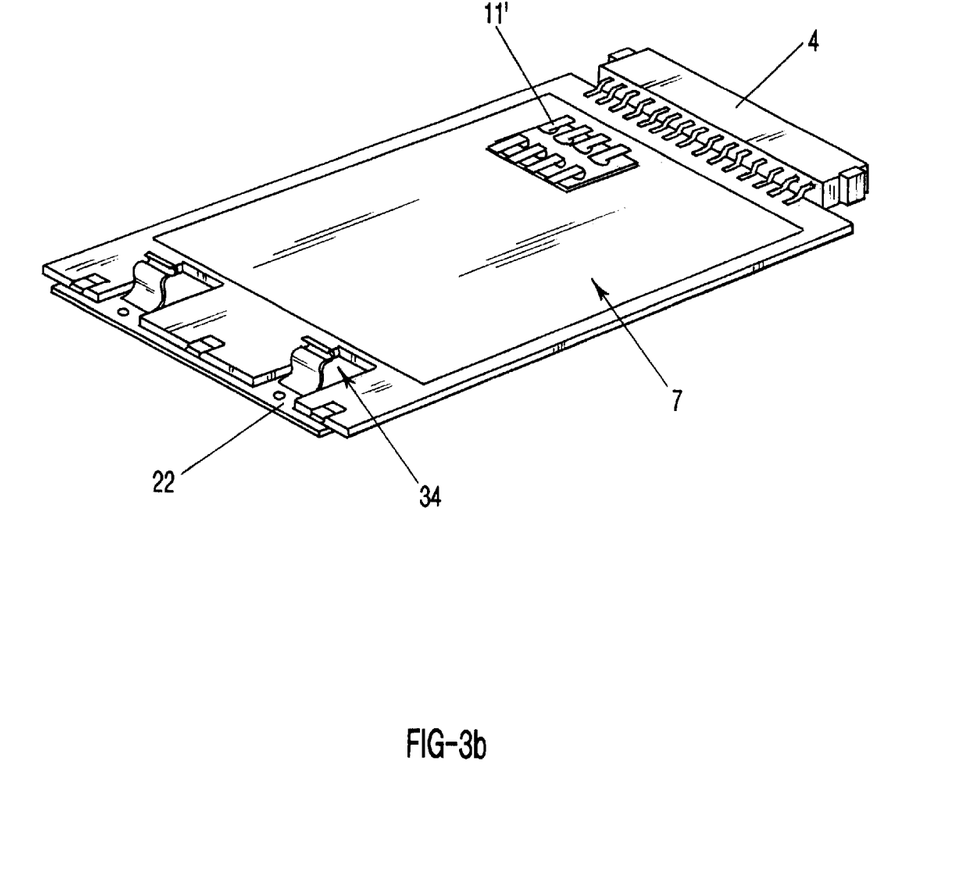
FIG. 3b is a perspective view of the attachment of the metal strip in accordance with FIG. 3a to a printed circuit board.

FIG. 3a illustrates the assembly of the metal strip 22 with the upper insertion guide 5 and FIG. 3b illustrates its [the metal strip's] assembly with the printed circuit board 7. The clamping contacts 32 in the metal strip 22 are arrested on the grounded contact surfaces 23 on the printed circuit board 7. Spring elements 33 that are integral to the metal strip 22 engage in the cut-outs 34 of the printed circuit board 7, as can be seen especially in FIG. 3b. The metal strip 22 is also provided with bores 35 and grounded contact springs 36. The bores 35 cooperate with corresponding pins 37 on the tier 21 in the strip 28, the metal strip 22 and the printed circuit board 7 connected to the metal strip 22 via the clamp contacts 32 being centered on the cover plate 6. The metal strip 22 is fixed by subsequent ultrasound welding.

Figure 4:
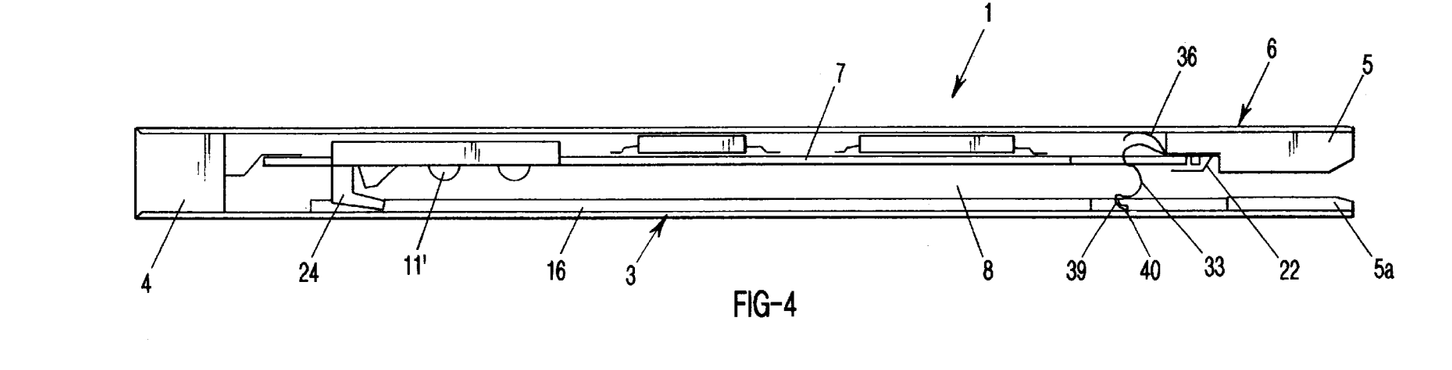
FIG. 4 illustrates a side view of the contact unit in accordance with FIG. 1.
Figure 4A:
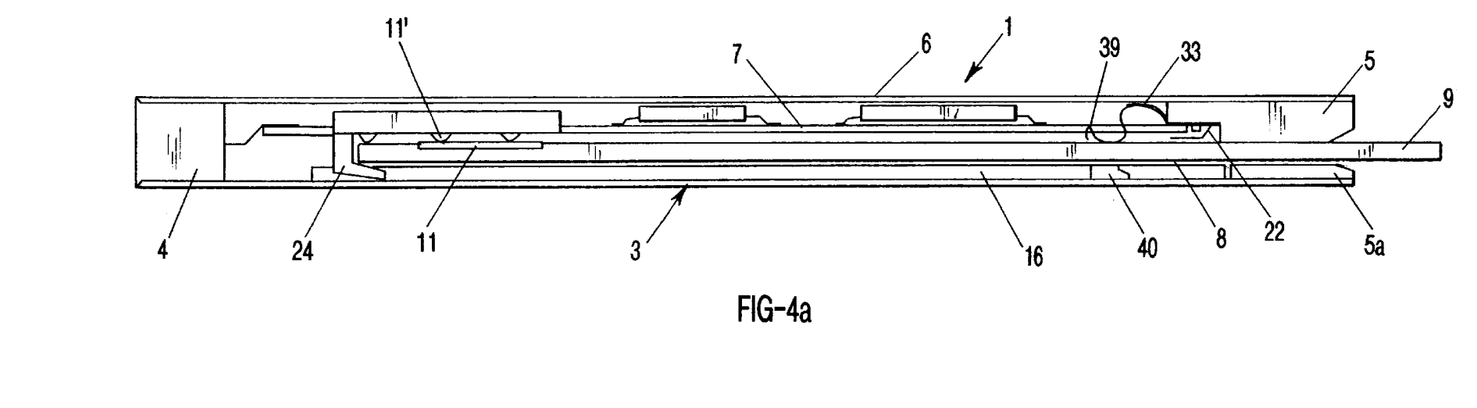

The functionality of the spring elements 33 integral to the metal strip 22 can be seen in FIGS. 4 and 4a. FIG. 4 illustrates the contact unit 1 with no chip-card 9 inserted, while as can be seen in FIG. 4a, the chip-card 9 has been inserted into the insertion channel 8 up to the rounded stop surfaces 24, the chip field 11 of the chip-card 9 coming to rest at the contact field 11' in the printed circuit board 7. The spring element 33 is essentially S-shaped and is provided at its free end with a claw-shaped extension 39 that engages under prestress when there is no inserted chip-card 9 a lock element 40 embodied as a recess in the reinforcing plate 16. As can be seen in FIG. 4a, the lock element 40 comprises an undercut that ensures that the spring element 33 is arrested. The cover plate 6 and the base plate 3 are connected to each other by the plastic holders 19, 20, 25, 26 such that they are subject to a clamping force. The spring element 33 ensures that the height of the insertion channel 8 does not change, which facilitates simple insertion of the chip-card 9. When the chip-card 9 is inserted into the insertion channel 8, the front of the chip-card 9 (relative to direction of insertion) presses the spring element 33 in the direction of the cover plate, the spring element 33 being pressed through the cut-out 34 in the printed circuit board 7 against the metal cover plate 6. Thus the chip-card 9 can be inserted into the insertion channel 8 up to the rounded stop surfaces 24 and is clamped therein by the internal stress inherent in the base and cover plates 3, 6. In addition, the spring element 33 presses on the chip-card 9 so that contact is assured between chip-card 11 and contact field 11'. When the chip-card 9 is removed from the insertion channel 8, the spring element 33 returns to the lock element 40, this also creating a connection between metal strip 22 respectively to cover plate 6 and base plate 3.

The alternative embodiment of the contact unit 1 illustrated in FIGS. 5 through 7a comprises on the base plate 3 and cover plate 6 in the region adjoining the insertion channel 8 in the direction of insertion additional welded brackets 41 by means of which the base plate 3 and cover plate 6 are joined together and the clamping internal stress in the contact unit 1 is obtained. In contrast to the embodiment in accordance with FIGS. 2 through 4a, the metal strip 22 does not comprise the spring element 33 so that when no chip-card 9 is inserted the insertion channel 8 in the contact unit 1 tapers from the welded brackets (which are also the swivelling axis) in the direction of the upper and lower insertion guides 5, 5a. When a chip-card 9 is inserted, the insertion channel 8 expands while generating a restoring force, this holding the chip-card 9 in the insertion channel 8 in a clamping manner. The welded brackets 41 on the cover plate 6 are offset for enabling the brackets 41 to be welded without infringing on the width dimensions in the PCMCIA standard. In addition, the plastic holders 19, 20, 25, and 26 can be welded together in a known manner.

Figure 5:
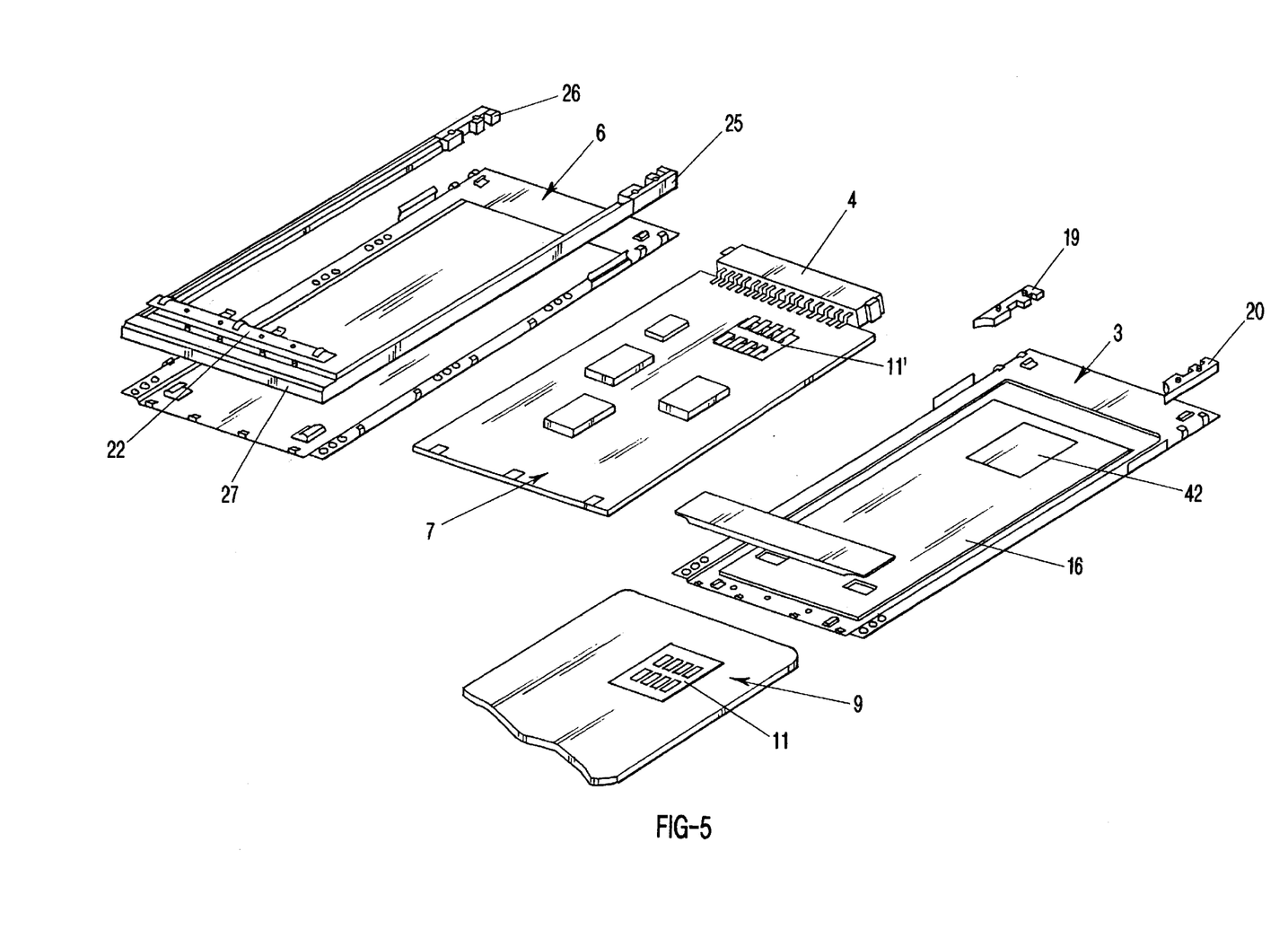
FIG. 5 illustrates the individual parts of an alternative embodiment of a contact unit in a perspective view of the housing members that have been flipped open and taken apart and their internal composition.
Figure 6:
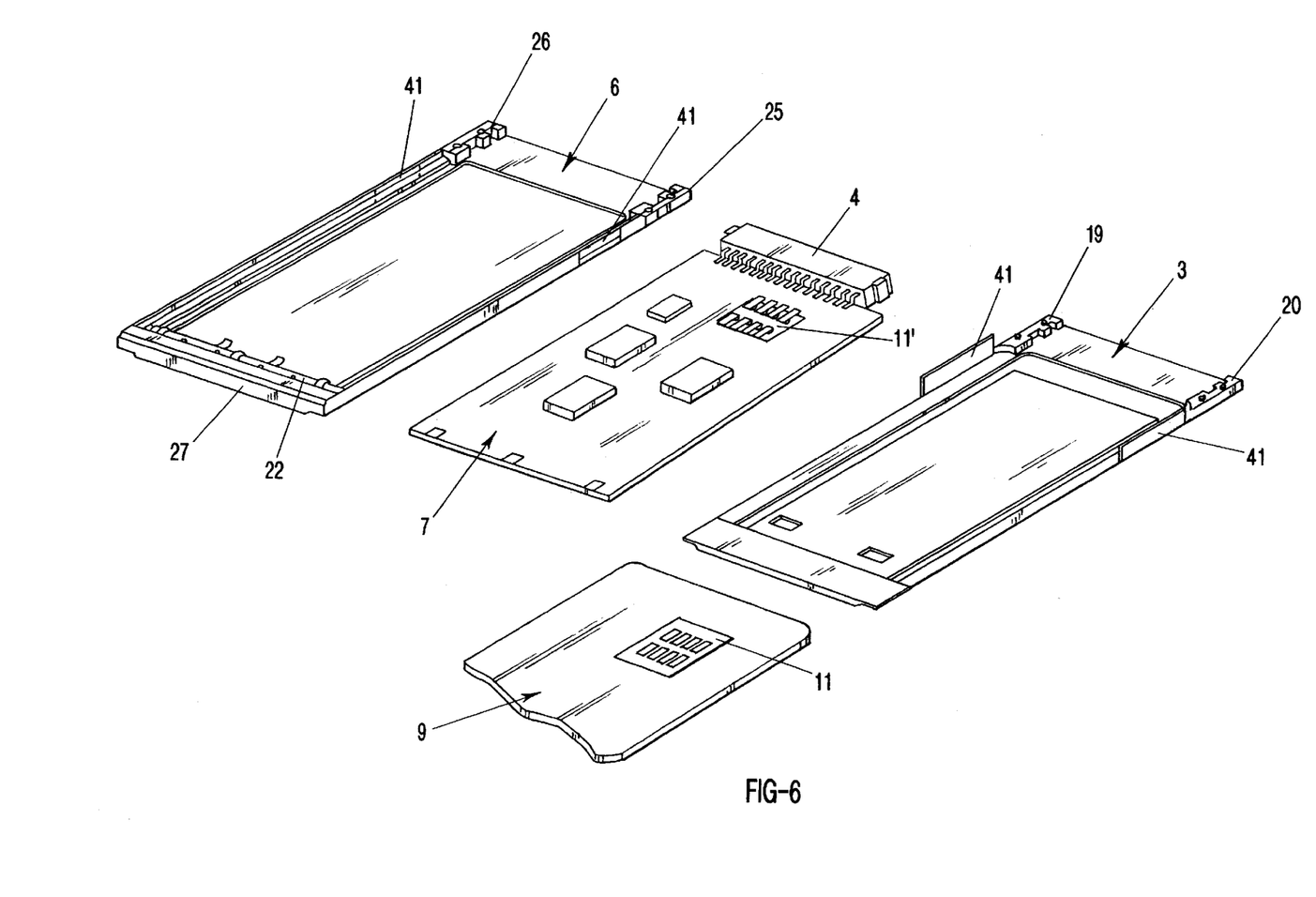
FIG. 6 illustrates the individual parts of the contact unit in accordance with FIG. 5 in an intermediate stage of assembly.
Figure 7:
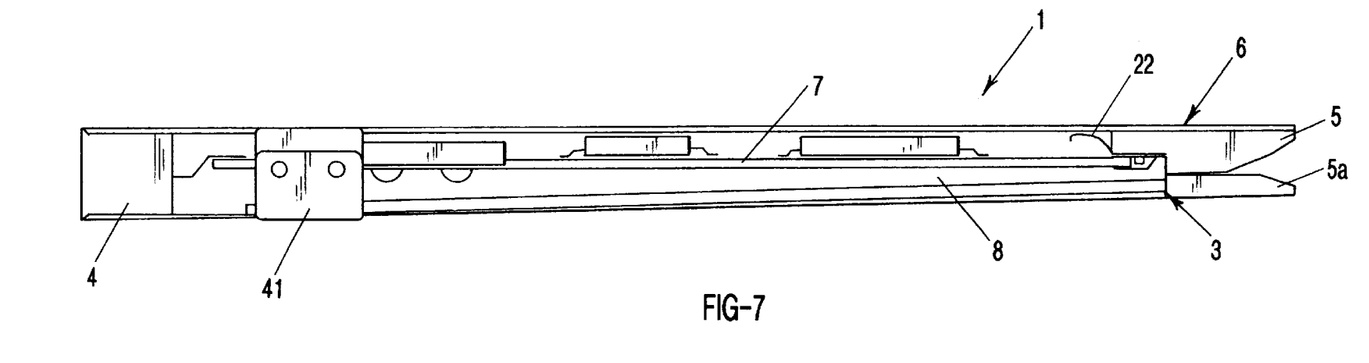
FIG. 7 shows a side view of the contact unit in accordance with FIG. 5 that does not have a chip-card inserted therein.
Figure 7A:
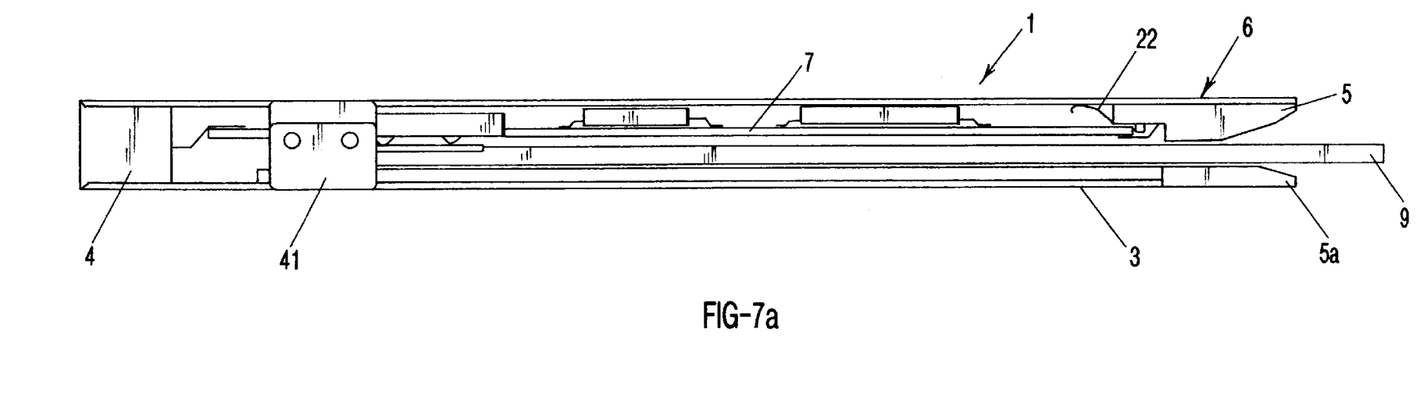
FIG. 7a illustrates a side view in accordance with FIG. 6 into which a chip-card has been inserted.

From FIGS. 2 and 5 it can be seen that the reinforcing plate 16 can be provided with an insulating film or element 42 that is used particularly when the reinforcing plate 16 is made of metal so that short-circuits can be prevented between the contact field 11' on the printed circuit board 7 and the reinforcing plate 16 arranged opposed thereto. In addition, a wear-resistant insulating film can be applied to the underside of the printed circuit board 7 to prevent wear on the chip-card 9 and to simultaneously insulate the conductors and through-contacts on the printed circuit board 7 on the side facing the insertion channel 8. It can also be seen from FIG. 2 that the lock element 40 can also embody a separate component that is pressed into recesses in the reinforcing plate 16. This is particularly simple and cost-effective. In order to make it simple to introduce a chip-card 9 into the insertion channel 8, the lower insertion guide 5a can in addition be embodied in the form of a lower lip (relative to the upper insertion guide 5 in the direction in which the chip-card 9 is inserted).

With the contact unit 1 described in the foregoing a chip-card reader is created that precisely corresponds to PCMCIA dimensions when a chip-card is not inserted and that provides assured contact and sufficient mechanical stability. In addition, security is increased in that the cover plate 6 and base plate 3 are congruent so that when inserted into the PCMCIA slot in a computer the base plate 3 and cover plate 6 are conducted into the lateral guides in the PCMCIA slot. This prevents the cover plate 6 from being forcibly bent upward or downward relative to the base plate 3 in an adjacent PCMCIA slot in the computer. Furthermore, the metal embodiment of the base plate 3 and cover plate 6 provides shielding and a high degree of functional stability and stability in the contact unit 1, even at high stagnation and ambient temperatures above 100° C. Finally, the contact unit 1 is also distinguished by simple and cost-effective manufacture.

The specification incorporates by reference the disclosure of German priority document 298 11 425.9 of Jun. 29, 1998 and European Patent Application priority document PCT/EP99/03560 of May 25, 1999.

The present invention is, of course, in no way restricted to the specific disclosure of the specification and drawings, but also encompasses any modifications within the scope of the appended claims.

| | |
|---|---|
| 1 | Contact unit |
| 2 | Exterior housing |
| 3 | Base plate |
| 4 | Plug-in strip |
| 5 | Upper insertion guide |
| 5a | Lower insertion guide |
| 6 | Cover plate |
| 7 | PCMCIA printed circuit board |
| 8 | Insertion channel |
| 9 | Chip-card |

-continued

| | |
|---|---|
| 10 | Insertion slot |
| 11 | Chip field |
| 11' | Contact field |
| 12 | Clips |
| 13 | Longitudinal side |
| 14 | Longitudinal side |
| 15 | Side |
| 16 | Reinforcing plate |
| 17 | Hook |
| 18 | Plastic profile |
| 19 | Plastic holder |
| 20 | Plastic holder |
| 21 | Platform or tier |
| 22 | Metal strip |
| 23 | Ground contact surface |
| 24 | Stop surfaces |
| 25 | Plastic holder |
| 26 | Plastic holder |
| 27 | Plastic holder |
| 28 | Strip |
| 29 | Step |
| 30 | Positioning projection/recess |
| 31 | Knobs |
| 32 | Clamp contact |
| 33 | Spring element |
| 34 | Cut-out |
| 35 | Bore |
| 36 | Grounded contact spring |
| 37 | Pin |
| 38 | End stop |
| 39 | Extension |
| 40 | Lock element |
| 41 | Welded bracket |
| 42 | Insulating element |

What is claimed is:

1. A contact unit for a card-shaped carrier element of electronic components, comprising:

an insertable card-shaped housing (2) having a base plate (3) and a cover plate (6) congruent to said base plate at least in a transverse direction, said base plate (3) and said cover plate (6) forming a slot-like insertion channel (8) therebetween, said insertion channel open at one end of said housing (2) for accommodating a chip-card (9) and continuously open on opposite longitudinal sides in a direction in which said chip-card is inserted, said base plate (3) and said cover plate (6) securely attached to one another solely in an attachment region adjacent to said insertion channel (8) in the direction of insertion of said chip-card (9), said base plate (3) and said cover plate (6) adapted to swivel relative to one another about a swivel axis, whereby a height of said insertion channel (8) is variable against an effect of a restoring force;

a plug-in strip (4) disposed at a side of said housing (2) opposite said one open side thereof; and a printed circuit board (7) electrically connected to said plug-in strip (4) and disposed in said housing (2) parallel to said insertion channel (8), wherein said printed circuit board (7) includes a contact field (11') for contact with said chip-card (9).

2. A contact unit according to claim 1, wherein the height of said insertion channel (8) decreases as a distance from said attachment region of said base plate and said cover plate increases when no chip-card (9) is inserted in said insertion channel (8).

3. A contact unit according to claim 1, further comprising a metal strip (22) connected to an end of said printed circuit board (7) opposite said plug-in strip (4), said metal strip (22) fixing the position of said printed circuit board (7) in said housing (2), said metal strip (22) having flexibly extending tabs (36) that rest in an electrically conductive manner against said cover plate (6), wherein said cover plate is metallic.

4. A contact unit according to claim 3, further comprising a plastic profile (18) connected to said cover plate (6), said metal strip (22) disposed on said plastic profile (18).

5. A contact unit according to claim 4, further comprising at least one spring element positioned in said insertion channel (8), wherein one end of said spring element is securely connected to said cover plate (6), and wherein the other end of said spring element can be detachably attached to said base plate (3).

6. A contact unit according to claim 5, wherein said printed circuit board (7) comprises cut-outs (34), said spring element (33) integrally produced and monolithic with said metal strip (22), said spring element (33) extending through said cut-outs (34) to said cover plate (6) when a chip-card (9) is inserted.

7. A contact unit according to claim 5, wherein said spring element (33) has an approximately S configuration and is provided at its free end with a claw-shaped extension (39) that engages a mating lock element (40) for securing said spring element.

8. A contact unit according to claim 7, wherein said lock element (40) is provided with an undercut.

9. A contact unit according to claim 7, wherein a reinforcing plate (16) made of plastic or metal is connected to said base plate (3), and wherein said lock element (40) is formed in said reinforcing plate.

10. A contact unit according to claim 9, wherein said reinforcing plate (16) comprises at least one layer, and wherein said lock element is a separate component in said reinforcing plate or as a recess therein.

11. A contact unit according to claim 1, wherein said base plate (3) has a plastic profile (18) at an end opposite said plug-in strip (4) that functions as a lower insertion guide (5a).

12. A contact unit according to claim 1, further comprising plastic holders (19, 20, 25, 26) for fastening said plug-in strip (4) to said base plate (3) and said cover plate (6) along respective edges of said base plate (3) and said cover plate (6).

13. A contact unit according to claim 1, further comprising lateral weld brackets (41) disposed on the cover plate (6), wherein said base plate (3) and said cover plate (6) are congruent and are welded to one another at said weld brackets.

14. A contact unit according to claim 1, wherein said insertion channel (8) includes at least one rounded stop surface (24) having a stop angle for limiting insertion movement of a chip-card (9).

* * * * *